(12) United States Patent
Pang et al.

(10) Patent No.: US 8,830,012 B2
(45) Date of Patent: *Sep. 9, 2014

(54) COMPOSITE BULK ACOUSTIC WAVE RESONATOR

(76) Inventors: Wei Pang, Beijing (CN); Hao Zhang, Zhuhai (CN)

( * ) Notice: Subject to any disclaimer, the term of this patent is extended or adjusted under 35 U.S.C. 154(b) by 536 days.

This patent is subject to a terminal disclaimer.

(21) Appl. No.: 12/876,813

(22) Filed: Sep. 7, 2010

(65) Prior Publication Data

US 2012/0056694 A1    Mar. 8, 2012

(51) Int. Cl.
*H03H 9/15*    (2006.01)
*H03H 9/17*    (2006.01)
*H03H 9/02*    (2006.01)

(52) U.S. Cl.
CPC ....... *H03H 9/02149* (2013.01); *H03H 9/02086* (2013.01); *H03H 9/173* (2013.01); *H03H 9/175* (2013.01)
USPC ............................ 333/187; 310/322; 310/335

(58) Field of Classification Search
CPC .............. H03H 9/02086; H03H 9/171–9/177; H03H 9/54; H03H 9/56; H03H 9/58; H03H 9/582; H03H 9/586–9/589; H03H 2003/02; H03H 2003/021; H03H 2003/025; H03H 2003/04; H03H 2003/041; H03H 2003/0442
USPC ........... 333/187–189; 310/322–324, 334, 335
See application file for complete search history.

(56) References Cited

U.S. PATENT DOCUMENTS

| | | | |
|---|---|---|---|
| 5,872,493 A | 2/1999 | Ella | |
| 6,441,703 B1 * | 8/2002 | Panasik | 333/189 |
| 6,761,692 B2 * | 7/2004 | Angelsen et al. | 600/459 |
| 6,906,451 B2 * | 6/2005 | Yamada et al. | 310/324 |
| 6,933,809 B2 * | 8/2005 | Kyoung et al. | 333/193 |
| 7,173,361 B2 * | 2/2007 | Saito et al. | 310/320 |
| 7,275,292 B2 * | 10/2007 | Ruby et al. | 29/25.35 |
| 7,276,836 B2 * | 10/2007 | Umeda et al. | 310/320 |
| 7,276,994 B2 * | 10/2007 | Takeuchi et al. | 333/189 |
| 7,304,551 B2 * | 12/2007 | Kawamura | 333/133 |
| 7,332,985 B2 * | 2/2008 | Larson et al. | 333/187 |
| 7,358,831 B2 * | 4/2008 | Larson et al. | 333/187 |
| 7,362,035 B2 * | 4/2008 | Jang et al. | 310/320 |
| 7,385,467 B2 * | 6/2008 | Stoemmer et al. | 333/189 |
| 7,619,493 B2 * | 11/2009 | Uno et al. | 333/187 |
| 7,701,117 B2 * | 4/2010 | Nakatsuka et al. | 310/320 |
| 7,745,975 B2 * | 6/2010 | Asai et al. | 310/331 |
| 7,760,049 B2 * | 7/2010 | Uno et al. | 333/193 |
| 7,770,274 B2 * | 8/2010 | Sano et al. | 29/25.35 |
| 7,924,120 B2 * | 4/2011 | Umeda | 333/187 |
| 8,125,123 B2 * | 2/2012 | Nishihara et al. | 310/365 |
| 8,330,556 B2 * | 12/2012 | Miller et al. | 333/187 |
| 2001/0028285 A1 * | 10/2001 | Klee et al. | 333/188 |
| 2004/0142497 A1 * | 7/2004 | Bradley | 438/3 |
| 2005/0057117 A1 * | 3/2005 | Nakatsuka et al. | 310/311 |
| 2007/0090892 A1 * | 4/2007 | Larson, III | 333/24.2 |
| 2011/0121916 A1 * | 5/2011 | Barber et al. | 333/187 |
| 2012/0074811 A1 * | 3/2012 | Pang et al. | 310/317 |

* cited by examiner

*Primary Examiner* — Barbara Summons
(74) *Attorney, Agent, or Firm* — Morris, Manning & Martin, LLP; Tim Tingkang Xia, Esq.

(57) ABSTRACT

In one aspect of the invention, the acoustic wave resonator includes a resonator structure having a first electrode, a piezoelectric layer formed on the first electrode, and a second electrode formed on the piezoelectric layer, and a composite layered structure associated with the resonator structure such that the immunity of the acoustic wave resonator to environmental change and aging effects is improved, the trimming sensitivity is substantially minimized, and/or dispersion characteristics of the acoustic wave resonator is optimized.

5 Claims, 12 Drawing Sheets

Table 1. Summary of trimming sensitivities and electromechanical coupling coefficients for 2 GHz resonators with different configurations

| No. | Acoustic Wave Resonator Configuration | Trimming sensitivity (kHz/Å) | $K_{t,eff}^2$ (%) |
|---|---|---|---|
| 1 | Mo/AlN/Mo/SiO$_2$<br>(0.19 μm/1.505 μm/0.19 μm/0.3 μm) | 50.6 | 6.79 |
| 2 | Mo/AlN/Mo/SiO$_2$/W/SiO$_2$<br>(0.21 μm/1.606 μm/0.21 μm/0.68 μm/0.636 μm/0.3 μm) | 1.0 | 6.04 |
| 3 | Mo/AlN/Mo/SiO$_2$/W/SiO$_2$<br>(0.21 μm/1.617 μm/0.21 μm/0.66 μm/0.63 μm/0.3 μm) | 0.64 | 6.02 |
| 4 | Mo/AlN/Mo/SiO$_2$/W/SiO$_2$<br>(0.21 μm/1.636 μm/0.21 μm/0.63 μm/0.60 μm/0.3 μm) | 0.66 | 5.99 |
| 5 | Mo/AlN/Mo/SiO$_2$/W/SiO$_2$<br>(0.23 μm/1.656 μm/0.23 μm/0.48 μm/0.45 μm/0.3 μm) | 1.14 | 5.64 |
| 6 | Mo/AlN/Mo/CDO/W/SiO$_2$<br>(0.2 μm/1.62 μm/0.2 μm/0.425 μm/0.636 μm/0.3 μm) | 0.13 | 5.91 |
| 7 | Mo/AlN/Mo/Al/W/SiO$_2$<br>(0.2 μm/1.615 μm/0.2 μm/0.787 μm/0.636 μm/0.3 μm) | 1.46 | 5.79 |
| 8 | Mo/AlN/Al/W/SiO$_2$<br>(0.29 μm/2 μm/0.787 μm/0.636 μm/0.3 μm) | 1.89 | 4.82 |
| 9 | Mo/AlN/Al/W/SiO$_2$<br>(0.15 μm/2.18 μm/0.937 μm/0.636 μm/0.3 μm) | 1.9 | 5.22 |

FIG. 7

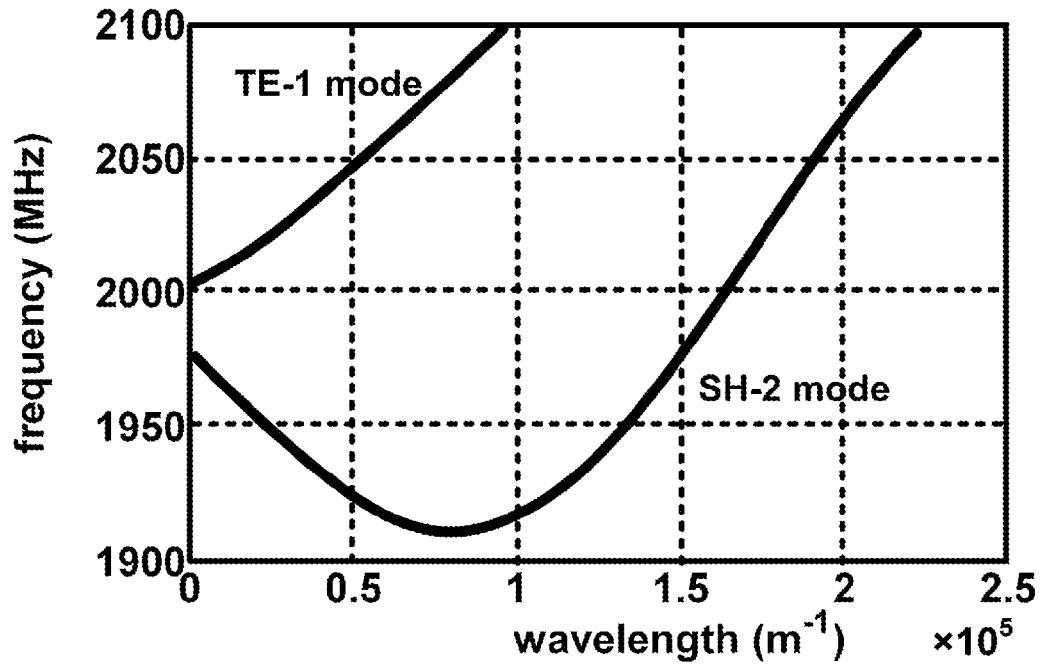
(a)
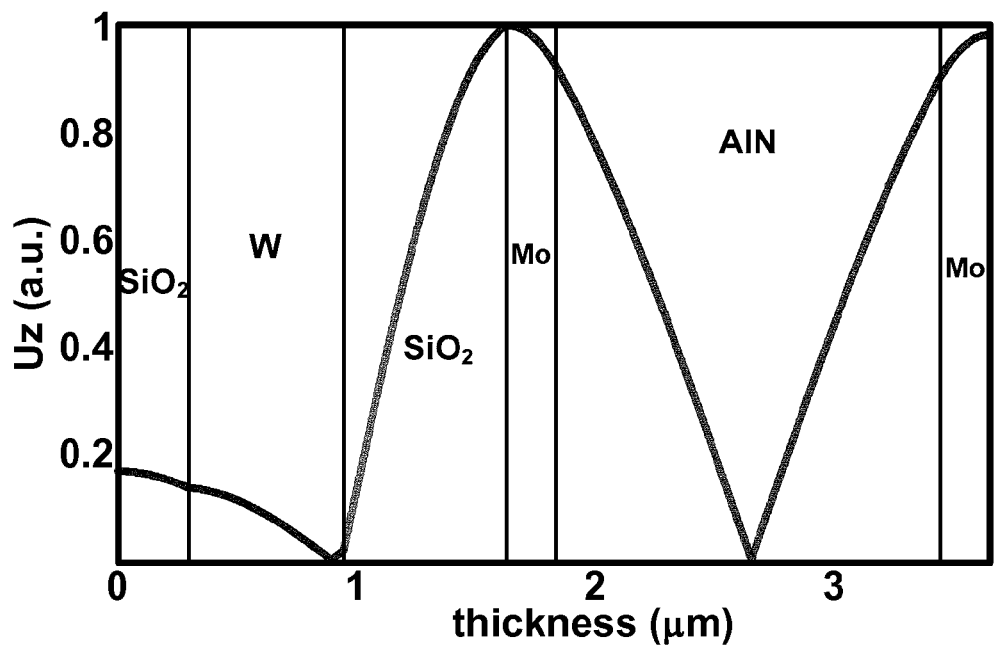
(b)
FIG. 8

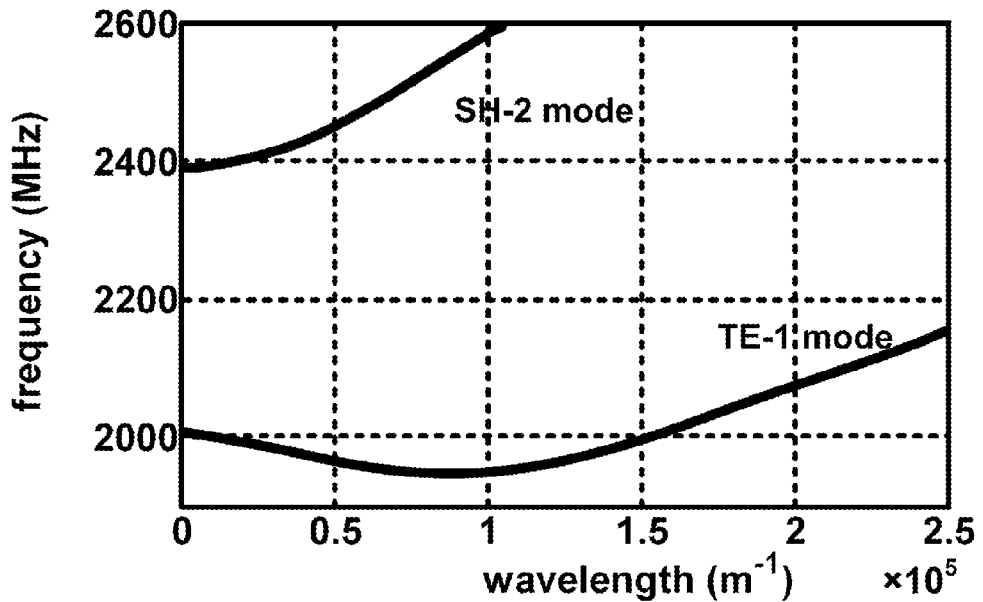
(a)
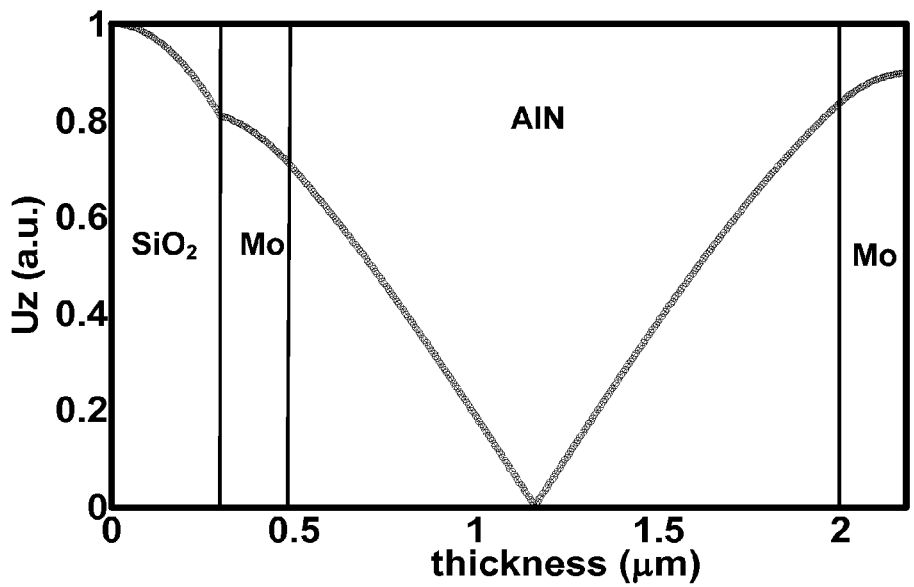
(b)
FIG. 12
(Related Art)

COMPOSITE BULK ACOUSTIC WAVE RESONATOR

CROSS-REFERENCE TO RELATED PATENT APPLICATION

Some references, which may include patents, patent applications and various publications, are cited and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference were individually incorporated by reference.

FIELD OF THE INVENTION

The present invention relates generally to an acoustic wave resonator and filter. More particularly, the invention relates to bulk acoustic wave (BAW) resonators and filters that utilize a composite layered structure including a plurality of layers alternately formed of a high acoustic impedance material and a low acoustic impedance material to improve the immunity to environmental change and aging effects, minimize the trimming sensitivity, and/or optimize the dispersion characteristics of the acoustic wave resonator.

BACKGROUND OF THE INVENTION

Piezoelectric bulk acoustic wave (BAW) resonators are widely employed in high performance radio-frequency (RF) filters and duplexers in wireless handsets. Compared to conventional RF ceramic filters and surface acoustic wave (SAW) filters, BAW filters have advantages of small form factor, low frequency drift with temperature, robust power handling, high frequency operation, etc. Combined with integrated circuits (IC), BAW resonators have also been used to build low phase noise oscillators and voltage controlled oscillators for frequency control applications. BAW resonators are usually manufactured on silicon wafers using IC fabrication processing techniques, which have a small footprint and low profile, very cost effective.

As shown in FIG. 11, a conventional BAW resonator 10 includes a piezoelectric layer 14, such as aluminum nitride, sandwiched between two metal electrodes 14a and 14b. When an RF electric signal is applied across the two electrodes 14a and 14b, the resonator body is mechanically extended and contracted due to the piezoelectric effect and an acoustic wave is excited in the structure 10. The acoustic wave propagates parallel to the applied electric field and is reflected at the interfaces of the electrodes 14a and 14b and air to form the resonance.

One example of a BAW resonator is a thin film bulk acoustic resonator (FBAR). The resonator includes a piezoelectric layer between bottom and top metal electrodes. The overlapping area of the two electrodes is the active area and acoustic energy is trapped there. Both sides of an FBAR are interfaced with air or vacuum, for example, an air cavity 13 formed on or in the substrate 11, to confine the acoustic wave. In practical implementation, the active area of the structure is suspended over a substrate. The bottom air interface is formed either using a sacrificial layer (which is then removed), or realized by etching part of the substrate away. The substrate is typically silicon, although other substrate materials can be used.

There is a second type of BAW resonator known as a solidly mounted resonator (SMR). In the SMR structure, the bottom electrode is mounted above an acoustic mirror stack comprising multiple reflective layers of low and high acoustic impedance materials, for example, low density silicon oxide and high density tungsten. The mirror stack replaces the air interface below the lower electrode in the FBAR structure, and provides isolation between the resonator and the silicon substrate, preventing acoustic losses into the substrate.

Resonant frequency of a BAW resonator is mainly determined by the thicknesses of all layers in the path of the acoustic wave propagation. The deposited films are not perfectly uniform, resulting in the device resonant frequency to have a distribution over the complete wafer. A frequency trimming is necessary to reduce the frequency distribution from several tens MHz down to several MHz to achieve a decent yield. In a BAW resonator, a trimming sensitivity is defined as a shift or change of resonant frequency of the BAW resonator with respect to change of top layer thickness and can be expressed in kHz per Angstrom. For example, a trimming sensitivity of 10 kHz/Angstrom indicates that a thickness of 1 Angstrom change of the top layer can cause a 10 kHz change in the resonant frequency of the resonator. The trimming sensitivity is proportional to the resonant frequency and typically in the range of 25-100 kHz/Å for 2 GHz resonators. When a BAW resonator frequency increases up to 5 GHz and the film layers in the resonator stack are made thinner, the trimming sensitivity could be as high as 250 kHz/Å. Trimming a wafer with such a high trimming sensitivity to a tight frequency distribution becomes extremely challenging.

Therefore, a heretofore unaddressed need exists in the art to address the aforementioned deficiencies and inadequacies.

SUMMARY OF THE INVENTION

In one aspect of the present invention, an acoustic wave resonator includes a substrate defining an air cavity, a first pair of low and high impedance layers formed on the substrate and located over the air cavity, a seed layer formed on the first pair of low and high impedance layers, a first electrode formed on the seed layer, a piezoelectric layer formed on the first electrode, a second electrode formed on the piezoelectric layer, a second pair of low and high impedance layers formed on the second electrode, and a passivation layer formed on the second pair of low and high impedance layers.

The first pair of low and high impedance layers includes a first high impedance layer formed over the air cavity, and a first low impedance layer formed between the first high impedance layer and the seed layer. The second pair of low and high impedance layers includes a second low impedance layer formed on the second electrode, and a second high impedance layers formed between the low impedance layer and the passivation layer.

In one embodiment, each of the first and second low impedance layers is formed of a first material having an acoustic impedance lower than about 20 Mrayl, and each of the first and second high impedance layers is formed of a second material having an acoustic impedance higher than about 40 Mrayl. The first material includes $SiO_2$, aluminum (Al), carbon-doped silicon oxide (CDO), nano-porous methyl silsesquioxane (MSQ), nano-porous hydrogensilsesquioxane (HSQ), nano-porous mixtures of MSQ and HSQ, nanoglass, aerogel, xerogel, spin-on-glasses (SOG) with the addition of pores in the final film, and spin-on siloxane monomers with additives to promote the formation of pores, parylene, or benzocyclobutene (BCB). The second material includes tungsten, molybdenum, platinum, ruthenium, iridium, titanium tungsten, tantalum pentoxide, hafnium oxide, aluminum oxide, chromium silicide, niobium carbide, rhenium oxide, tantalum carbide, tantalum nitride, titanium carbide, titanium oxide, vanadium carbide, tungsten nitride, tungsten oxide, zirconium carbide, silicon carbon (SiC), diamond-like carbon (DLC), or silicone doped diamond-like carbon (Si-DLC).

In one embodiment, each of the first and second low impedance layers and the first and second high impedance layers has a thickness in a range of about 20 nm to about 1000 nm.

In one embodiment, the passivation layer is formed of a material including silicon carbide (SiC), aluminum oxide ($Al_2O_3$), diamond, diamond-like carbon (DLC), silicon oxide ($SiO_2$), silicon nitride (SiN), hydrophobic polymer, or a combination thereof. The seed layer is formed of aluminum nitride, aluminum oxynitride, tungsten nitride, titanium tungsten nitride, silicon oxide, silicon nitride, silicon carbide, or a combination thereof.

In another aspect of the present invention, an acoustic wave resonator includes a substrate, a first electrode supported by the substrate, a piezoelectric layer formed on the first electrode, a second electrode formed on the piezoelectric layer, a pair of low and high impedance layers formed in contact with one of the first and second electrodes, and a passivation layer formed on the second electrode if the pair of low and high impedance layers is in contact with the first electrode, or on the pair of low and high impedance layers if the pair of low and high impedance layers is in contact with the second electrode.

In one embodiment, the substrate is provided with an air cavity, whereby the pair of low and high impedance layers is formed on the substrate and located over the air cavity and is in contact with the first electrode.

In another embodiment, the substrate is provided with an air cavity or an acoustic mirror, whereby the first electrode is formed on the substrate and located over the air cavity or the acoustic mirror, and the pair of low and high impedance layers is in contact with the second electrode.

The pair of low and high impedance layers includes a low impedance layer and a high impedance layer. Each of the low impedance layer and the high impedance layer has a thickness in a range of about 20 nm to about 1000 nm. In one embodiment, the low impedance layer is formed between the piezoelectric layer and the high impedance layer. The low impedance layer is formed of a first material having an acoustic impedance lower than about 20 Mrayl, and the high impedance layer is formed of a second material having an acoustic impedance higher than about 40 Mrayl. In one embodiment, the first material includes $SiO_2$, Al, CDO, MSQ, HSQ, nanoporous mixtures of MSQ and HSQ, nanoglass, aerogel, xerogel, SOG with the addition of pores in the final film, and spin-on siloxane monomers with additives to promote the formation of pores, parylene, SiLK, or BCB, and the second material includes tungsten, molybdenum, platinum, ruthenium, iridium, titanium tungsten, tantalum pentoxide, hafnium oxide, aluminum oxide, chromium silicide, niobium carbide, rhenium oxide, tantalum carbide, tantalum nitride, titanium carbide, titanium oxide, vanadium carbide, tungsten nitride, tungsten oxide, zirconium carbide, SiC, DLC, or Si-DLC.

In one embodiment, the passivation layer is formed of a material including SiC, $Al_2O_3$, DLC, $SiO_2$, SiN, hydrophobic polymer, or a combination thereof.

In yet another aspect of the present invention, an acoustic wave resonator includes a substrate, a first electrode supported by the substrate, a piezoelectric layer formed on the first electrode, a second electrode formed on the piezoelectric layer, and a passivation layer formed on the second electrode, where at least one of the first and second electrodes includes a pair of low and high impedance layers.

In one embodiment, the substrate is provided with an air cavity, whereby the first electrode includes the pair of low and high impedance layers formed on the substrate and located over the air cavity.

In another embodiment, the substrate is provided with an air cavity or an acoustic mirror, whereby the first electrode includes a metal electrode formed on the substrate and located over the air cavity or the acoustic mirror.

The pair of low and high impedance layers includes a low impedance layer and a high impedance layer. Each of the low impedance layer and the high impedance layer has a thickness in a range of about 20 nm to about 1000 nm. In one embodiment, the low impedance layer is formed between the piezoelectric layer and the high impedance layer. The low impedance layer is formed of a first material having an acoustic impedance lower than about 20 Mrayl, and the high impedance layer is formed of a second material having an acoustic impedance higher than about 40 Mrayl. In one embodiment, the first material includes $SiO_2$, Al, CDO, MSQ, HSQ, nanoporous mixtures of MSQ and HSQ, nanoglass, aerogel, xerogel, SOG with the addition of pores in the final film, and spin-on siloxane monomers with additives to promote the formation of pores, parylene, or BCB, and the second material includes tungsten, molybdenum, platinum, ruthenium, iridium, titanium tungsten, tantalum pentoxide, hafnium oxide, aluminum oxide, chromium silicide, niobium carbide, rhenium oxide, tantalum carbide, tantalum nitride, titanium carbide, titanium oxide, vanadium carbide, tungsten nitride, tungsten oxide, zirconium carbide, SiC, DLC, or Si-DLC.

In one embodiment, the passivation layer is formed of a material including SiC, $Al_2O_3$, DLC, $SiO_2$, SiN, hydrophobic polymer, or a combination thereof.

In a further aspect of the present invention, an acoustic wave resonator fabricated on a substrate includes a seed layer, a resonator structure having a first electrode formed on the seed layer, a piezoelectric layer formed on the first electrode, and a second electrode formed on the piezoelectric layer, and a composite layered structure associated with the resonator structure such that the immunity of the acoustic wave resonator to environmental change and aging effects is improved, the trimming sensitivity is substantially minimized, or dispersion characteristics of the acoustic wave resonator is optimized.

In one embodiment, the composite layered structure includes a plurality of layers alternately formed of a first material with high acoustic impedance and a second material with low acoustic impedance, where layers with high acoustic impedance and layers with low acoustic impedance are alternately adjacently disposed. In one embodiment, each of the plurality of layers has a thickness that is approximately equal to an odd integral multiple of one quarter of the wavelength in the material of the respective layer at the resonant frequency of the resonator.

In one embodiment, the composite layered structure includes a first layer with low acoustic impedance adjacent to the seed layer and a second layer with high acoustic impedance formed on the first layer such that the first layer is located between the seed layer and the second layer. In another embodiment, the composite layered structure further includes a third layer with low acoustic impedance formed on the second electrode of the resonator structure and a fourth layer with high acoustic impedance formed on the third layer.

In another embodiment, the composite layered structure includes a first layer with low acoustic impedance formed on the second electrode of the resonator structure and a second layer with high acoustic impedance formed on the first layer.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment, and wherein:

FIG. 7 shows Table 1 summarizing of trimming sensitivities and electromechanical coupling coefficients for 2 GHz resonators with different configurations/embodiments according to the present invention;

FIG. 8 shows (a) a simulated dispersion curve of an acoustic wave resonator listed as resonator No. 2 of FIG. 7, and (b) a simulated standing wave relative displacement magnitude as a function of depth into the acoustic wave resonator, respectively;

FIG. 12 shows (a) a simulated dispersion curve of a conventional acoustic wave resonator listed as resonator No. 1 of FIG. 7, and a simulated standing wave relative displacement magnitude as a function of depth into the conventional acoustic wave resonator listed as resonator, respectively.

DETAILED DESCRIPTION OF THE INVENTION

Figure 1:
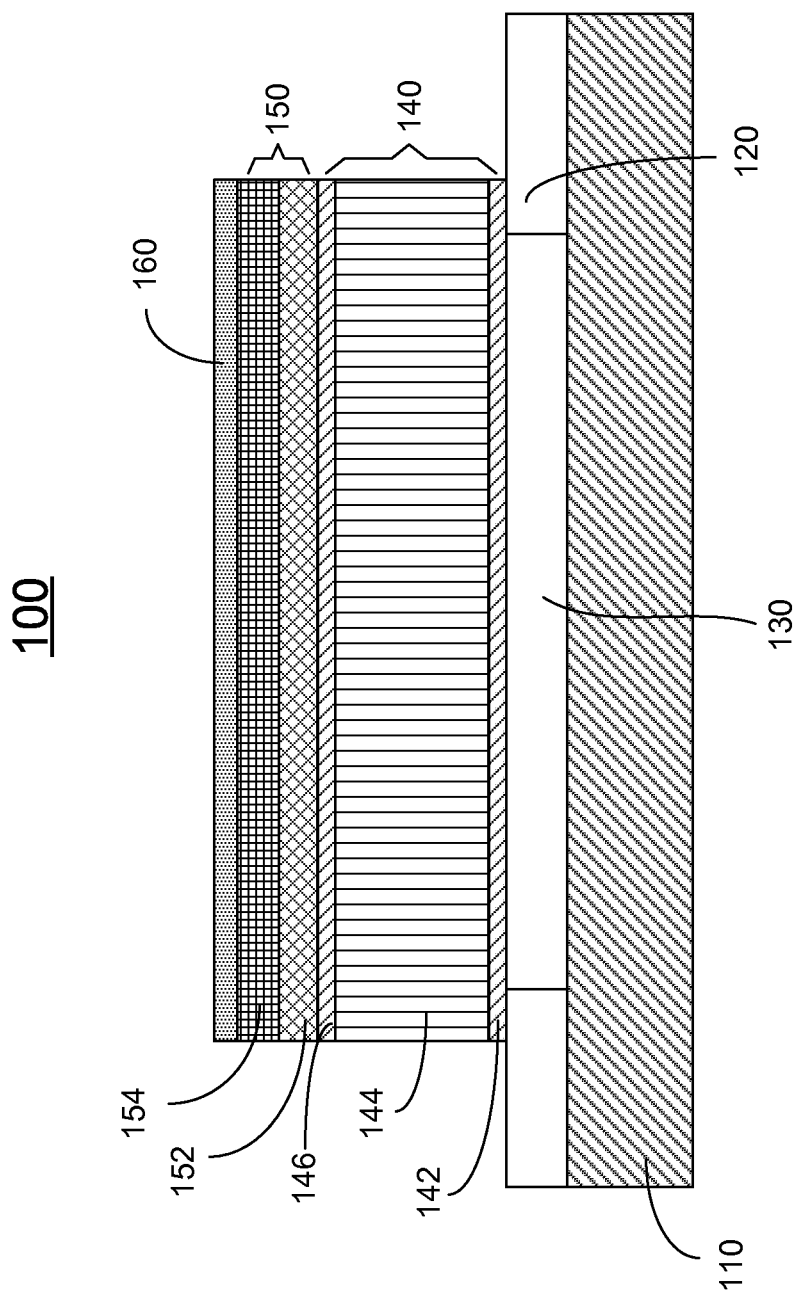
FIG. 1 shows schematically a cross sectional view of an acoustic wave resonator according to one embodiment of the present invention.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, "plurality" means two or more.

As used herein, the terms "comprising," "including," "carrying," "having," "containing," "involving," and the like are to be understood to be open-ended, i.e., to mean including but not limited to.

The term "layer", as used herein, refers to a thin sheet or thin film.

The term "electrode", as used herein, is an electrically conductive layer or film comprising a single-layer structure or a multi-layer structure formed of one or more electrically conductive materials.

The term "piezoelectric layer" as used herein, is a layer comprising one or more different layers, of which at least one exhibits piezoelectric activity. The other layers may be non-piezoelectric dielectric or used to perform special performance effects like temperature coefficient compensation or to facilitate manufacturing like adhesion layers. In addition, the other layers are typically thin when compared to the at least one layer exhibiting piezoelectric activity.

The description will be made as to the embodiments of the present invention in conjunction with the accompanying drawings of FIGS. 1-10. In accordance with the purposes of this invention, as embodied and broadly described herein, this invention, in one aspect, relates to an acoustic wave resonator that utilizes a composite layered structure including a plurality of layers alternately formed of a high acoustic impedance material and a low acoustic impedance material to improve the immunity to environmental change and aging effects, minimize the trimming sensitivity, and/or optimize the dispersion characteristics of the acoustic wave resonator.

The present invention applies to both types of FBAR and SMR, though the following descriptions are made as to the exemplary embodiments of the FBAR. According to the present invention, the composite FBAR resonator comprises an FBAR and at least a pair of low and high acoustic impedance layers associated with the FBAR. As listed in Table 1 of FIG. 7, the composite FBAR resonator having a pair of low and high acoustic impedance layers (e.g., resonator Nos. 2-9) has significantly lower trimming sensitivity, which facilitates frequency trimming and allows fabrication of a high frequency filter with a higher product yield and lower manufacturing cost than conventional FBAR structures (e.g., resonator No. 1).

Referring to FIG. 1, an acoustic wave resonator 100 is schematically shown according to one embodiment of the present invention. In the exemplary embodiment, the acoustic wave resonator 100 includes a substrate 110, a resonator structure 140 having a first (bottom) electrode 142, a piezoelectric layer 144 formed on the first electrode 142, and a second (top) electrode 146 formed on the piezoelectric layer 144, and a composite layered structure 150 having a low impedance layer 152 formed on the second electrode 146 of the resonator structure 140 and a high impedance layer 154 formed on the low impedance layer 152. In other words, the low impedance layer 152 is formed between the piezoelectric layer 144 and the high impedance layer 154. Further, a passivation layer 160 is formed of a material including SiC, $Al_2O_3$, DLC, $SiO_2$, SiN, hydrophobic polymer, or the like, on the high impedance layer 154 of the composite layered structure 150.

In one embodiment, the substrate 110 is provided with an air cavity or an acoustic mirror 130 formed on or in the substrate 110 such that the first electrode 142 of the resonator structure 140 is formed on the substrate 110 and located over the air cavity or the acoustic mirror 130. Alternatively, the air cavity or the acoustic mirror 130 can be defined by a dielectric layer 120 formed on the substrate 110. In the case, the first electrode 142 of the resonator structure 140 is formed on the dielectric layer 120 and located over the air cavity or the acoustic mirror 130, as shown in FIG. 1.

The low impedance layer 152 is formed of a first material having an acoustic impedance preferably lower than about 20 Mrayl, and the high impedance layer 154 is formed of a second material having an acoustic impedance preferably higher than about 40 Mrayl. For example, the first material includes, but is not limited to, $SiO_2$, Al, CDO, MSQ, HSQ, nano-porous mixtures of MSQ and HSQ, nanoglass, aerogel, xerogel, SOG with the addition of pores in the final film, and spin-on siloxane monomers with additives to promote the formation of pores, parylene, or BCB. The second material includes, but is not limited to, tungsten, molybdenum, platinum, ruthenium, iridium, titanium tungsten, tantalum pentoxide, hafnium oxide, aluminum oxide, chromium silicide, niobium carbide, rhenium oxide, tantalum carbide, tantalum nitride, titanium carbide, titanium oxide, vanadium carbide, tungsten nitride, tungsten oxide, zirconium carbide, SiC, DLC, or Si-DLC.

Each of the low impedance layer 152 and the high impedance layer 154 has a thickness. Each thickness is same or substantially different from one another, and can be in a range of about 20 nm to about 1000 nm.

According to the present invention, it is the pair of low and high acoustic impedance layers 152 and 154 formed on the top of the resonator structure 140 that reduces the frequency trimming sensitivity of the acoustic wave resonator 100, thereby making it easier to accurately trim the acoustic wave resonator 100 to a desired resonant frequency. The reduction of the sensitivity is due to the less acoustic energy trapped in the pair of low and high acoustic impedance layers 152 and 154, and thus, trimming has a reduced impact on the frequency change. As shown in Table 1 of FIG. 7, the incorporation of the pair of low and high acoustic impedance layers may also reduce the effective electromechanical coupling coefficient ($K_{t,eff}^2$) of the acoustic wave resonator and bandwidth of the filter built with such resonators.

For example, for the acoustic wave resonator 100 of configuration No. 2, the first electrode 142, the piezoelectric layer 144, the second electrode 146, the low acoustic impedance layer 152, the high acoustic impedance layer 154, and the passivation layer 160 are formed of Mo, AlN, Mo, $SiO_2$, W, and $SiO_2$ with a thickness of 0.21 µm, 1.606 µm, 0.21 µm, 0.68 µm, 0.636 µm, and 0.3 µm, respectively. In this example, each layer thickness of the low acoustic impedance layer 152 and the high acoustic impedance layer 154 is approximately equal to one quarter of the wavelength in the material of the respective layer at the resonant frequency of the resonator. Alternatively, each thickness of the low acoustic impedance layer 152 and the high acoustic impedance layer 154 could be smaller or larger than quarter wavelength (e.g., configuration Nos. 3 and 4), preferred to be within, but not limited to, ±15% of the target thickness.

Accordingly, the trimming sensitivity of the acoustic wave resonator 100 is reduced to about 1.0 kHz/Å, which is about 50 times less than that of a conventional acoustic wave resonator, listed as configuration No. 1 of Table 1 in FIG. 7. Further, the $K_{t,eff}^2$ of the acoustic wave resonator 100 is also reduced, compared to that of the conventional acoustic wave resonator.

As shown in FIG. 8, for such a configuration (No. 2), the amplitude of normalized displacement at the surface of the passivation $SiO_2$ layer 160 is substantially reduced, compared to that of the conventional acoustic wave resonator, as shown in FIG. 12. Accordingly, an absorbed material on the passivation $SiO_2$ layer 160 has little effect on the resonance frequency drift over time, which alleviates susceptibility of the acoustic wave resonator from frequency drifts due to interaction with its environment such as air or moisture and substantially relaxes the packaging hermeticity requirements. Note that the composite layered structure may have a plurality of low and high acoustic impedance layers formed on one or both sides of the resonator structure, where the membrane is suspended on an air cavity, while in the SMR case, the composite layered structure only applies to the top side of the resonator structure because the acoustic mirror already exists between the bottom electrode of the acoustic wave resonator and the substrate.

The composite layered structure has another advantage in altering the dispersion characteristics of the acoustic wave resonator according to needs for a specific application. FIG. 12(a) shows the simulated dispersion curve of a conventional FBAR (configuration No. 1), that is a type II resonator, where the cutoff frequency of the first thickness extensional (TE-1) mode is identical to the series resonant frequency ($f_s$) of the resonator because AlN is a type II piezoelectric material. By incorporating low and high impedance layers with appropriate thicknesses and mechanical material parameters (such as density, elastic constant, acoustic velocity, and etc.), the dispersion type of an FBAR or SMR can be tuned from type II to type I, or vice versa. The dispersion curve of one example of the composite FBAR resonator (No. 2) is shown in FIG. 8(a). This resonator behaves like a type I acoustic wave resonator where the longitudinal cutoff frequency of TE1 mode is higher than the second shear wave cutoff frequency. In addition, introducing the composite layered structure can change the dispersion intensity alone, which can be observed when comparing the dispersion curves of acoustic wave resonators Nos. 2 and 3 shown in FIG. 8(a) and FIG. 9, respectively.

Figure 9:
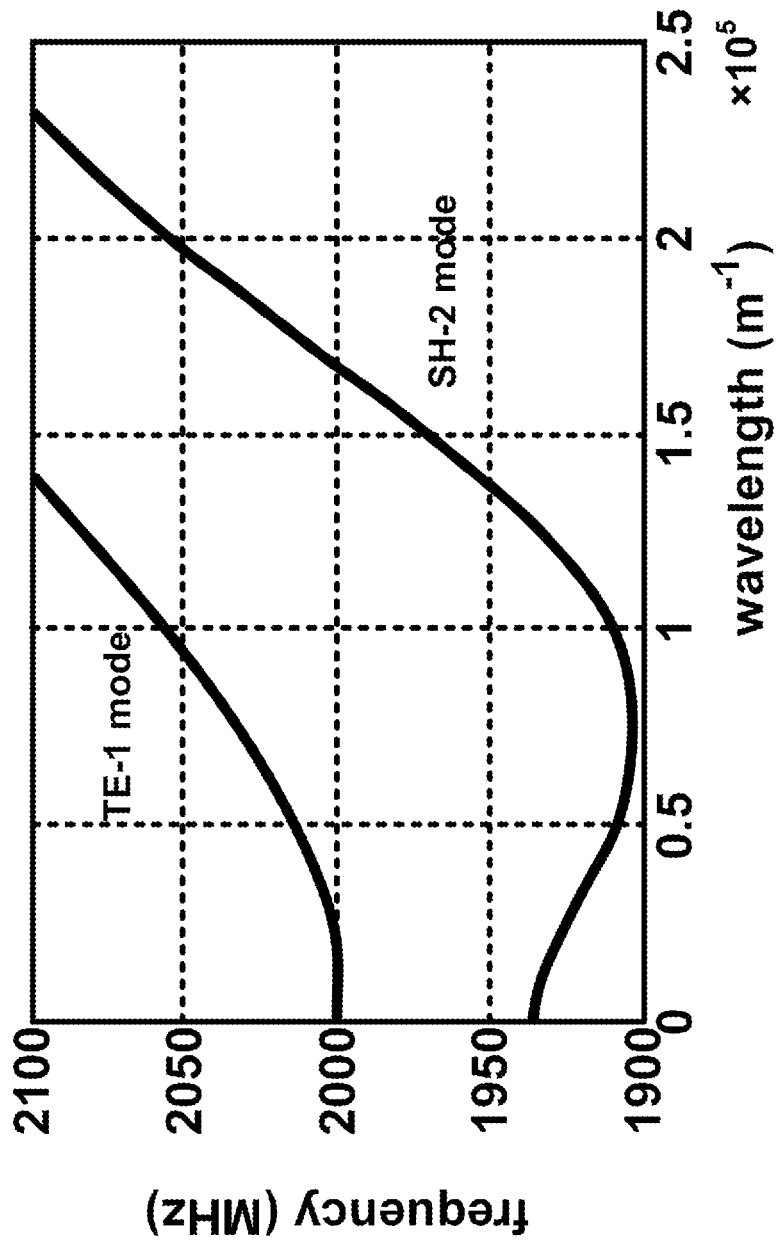
FIG. 9 shows a simulated dispersion curve of an acoustic wave resonator listed as resonator No. 3 of FIG. 7.
Figure 10:
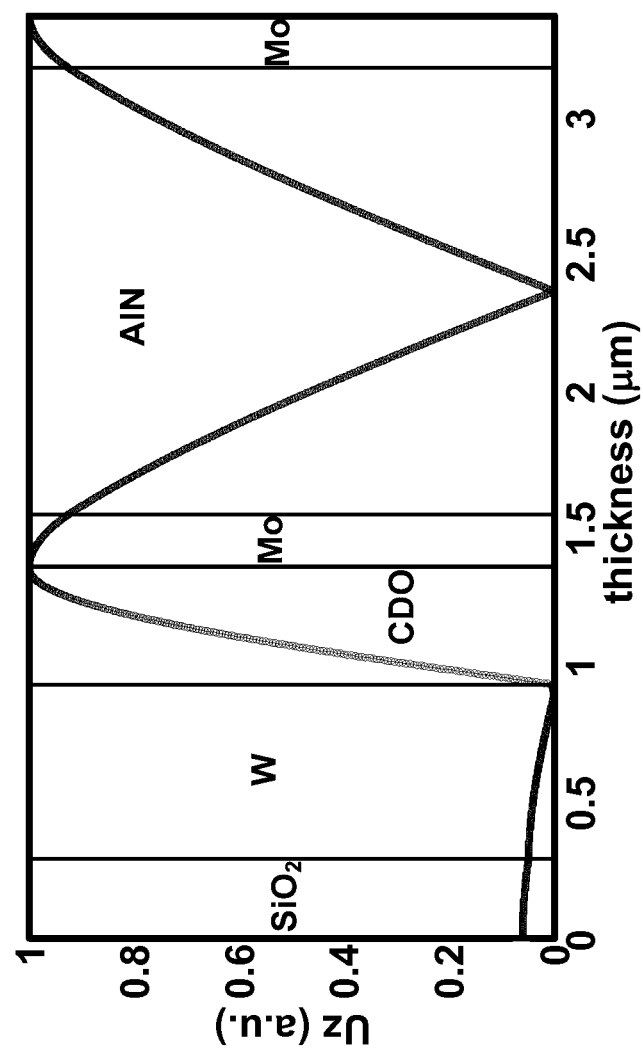
FIG. 10 shows a simulated standing wave relative displacement magnitude as a function of depth into an acoustic wave resonator listed as resonator No. 6 of FIG. 7.
Figure 11:
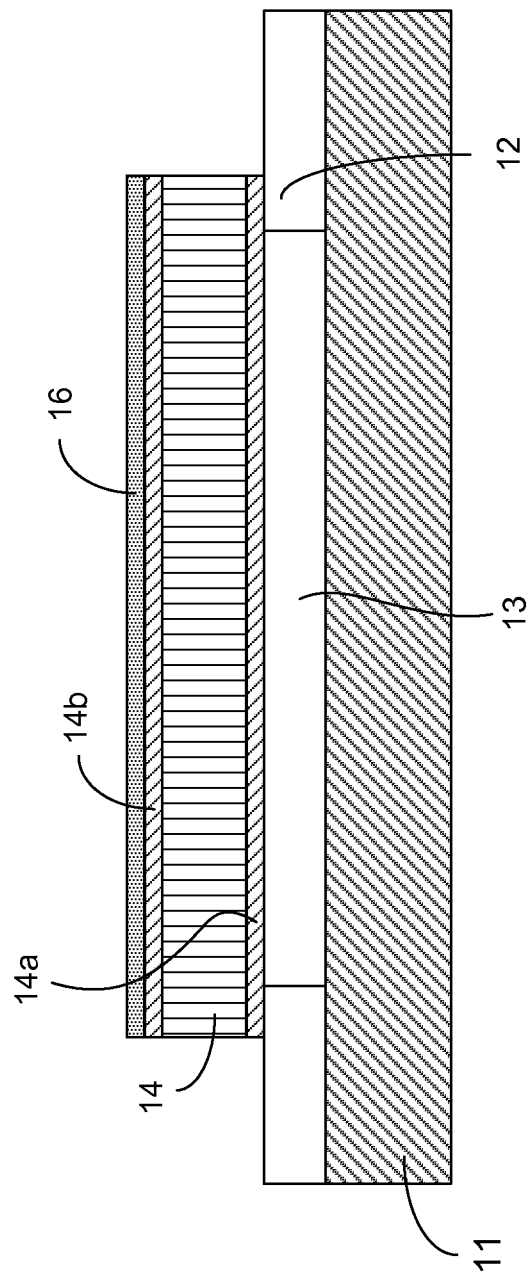
FIG. 11 shows a cross sectional view of a conventional acoustic wave resonator.

Additionally, proper changes in the thicknesses of the piezoelectric layer 144, the low acoustic impedance layer 152, and/or the high acoustic impedance layer 154 may lead further reductions of the trimming sensitivity while maintaining relatively high $K_{t,eff}^2$ of the acoustic wave resonator 100. For example, for the configuration No. 3 in the Table 1, the thicknesses of the piezoelectric layer 144, the low acoustic impedance layer 152, and the high acoustic impedance layer 154 are of 1.617 μm, 0.66 μm, and 0.63 μm, respectively, which are only slightly different from those of the configuration No. 2. The trimming sensitivity and the $K_{t,eff}^2$ of the acoustic wave resonator in this configuration (No. 3) are about 0.64 kHz/Å, and 6.02%, respectively. The former is 35% smaller than that of the configuration No. 2 and the latter is about the same. The dispersion curve of the acoustic wave resonator (No. 3) is shown in FIG. 9. The acoustic wave resonators of configuration Nos. 2-5 are formed of essentially same materials, but the layer thicknesses of each of the acoustic wave resonators of configuration Nos. 2-5 are different. The trimming sensitivity and the $K_{t,eff}^2$ of the acoustic wave resonators are varied with the layer thicknesses. Furthermore, the trimming sensitivity and $K_{t,eff}^2$ of the acoustic wave resonator 100 are also varied with the materials forming the low acoustic impedance layer 152, and/or the high acoustic impedance layer 154. As shown in the configuration No. 6 of the Table 1 in FIG. 7, when the first electrode 142, the piezoelectric layer 144, the second electrode 146, the low acoustic impedance layer 152, the high acoustic impedance layer 154, and the passivation layer 160 are formed of Mo, AlN, Mo, CDO, W, and $SiO_2$ with a thickness of 0.2 μm, 1.62 μm, 0.2 μm, 0.425 μm, 0.636 μm, and 0.3 μm, respectively, the trimming sensitivity of the acoustic wave resonator 100 is about 0.13 kHz/Å, which is about 390 times less than that of a conventional acoustic wave resonator (No. 1 of Table 1 in FIG. 7) mainly due to the exceptionally low acoustic impedance of CDO. The $K_{t,eff}^2$ of the acoustic wave resonator 100 is about 5.91%, which is smaller than that of the conventional acoustic wave resonator. The standing wave relative displacement magnitude as a function of depth into the acoustic wave resonator (No. 6) is shown in FIG. 10.

Figure 2:
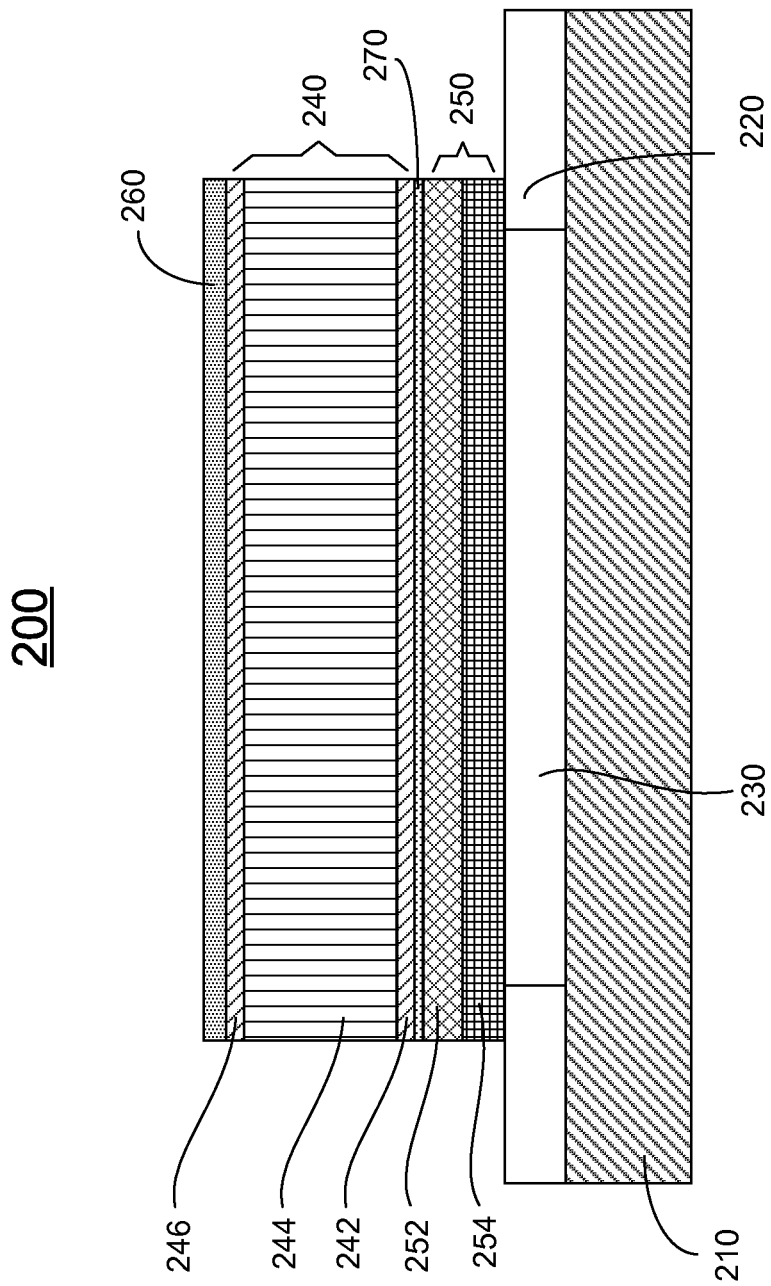
FIG. 2 shows schematically a cross sectional view of an acoustic wave resonator according to another embodiment of the present invention.

Referring to FIG. 2, an acoustic wave resonator 200 is schematically shown according to another embodiment of the present invention. Similar to the acoustic wave resonator 100 shown in FIG. 1, the acoustic wave resonator 200 also has a resonator structure 240 having a first (bottom) electrode 242, a piezoelectric layer 244 formed on the bottom electrode 242, and a second (top) electrode 246 formed on the piezoelectric layer 244, and a composite layered structure 250 having a low impedance layer 252 and a high impedance layer 254. However, the composite layered structure 250 is formed adjacent to the bottom electrode 242 of the resonator structure 240. Additionally, a seed layer 270 is formed between the resonator structure 240 and the composite layered structure 250.

Specifically, a substrate 210 is provided with an air cavity 230. The high impedance layer 254 is formed on the substrate 210 and located over the air cavity 230. The low impedance layer 252 is formed on the high impedance layer 255. The seed layer 270 is formed of aluminum nitride, aluminum oxynitride, tungsten nitride, titanium tungsten nitride, silicon oxide, silicon nitride, silicon carbide, or the like, on the low impedance layer 252 of the composite layered structure 250. The bottom electrode 242 of the resonator structure 240 is formed on the seed layer 270. Further, a passivation layer 260 is formed of a material including SiC, $Al_2O_3$, DLC, $SiO_2$, SiN, hydrophobic polymer, or the like, on the top electrode 246 of the resonator structure 240. Optionally, the air cavity 230 can be defined by a dielectric layer 220 formed on the substrate 210. In this case, the high impedance layer 254 is formed on the dielectric layer 220 and located over the air cavity 230, as shown in FIG. 2. The utilization of the composite layered structure 250 improves the immunity of the resonator to external environmental change and aging effects and provide an option to alter the dispersion characteristics of the resonator upon needed.

Similar to the pair of low and high impedance layers 152 and 154 of the acoustic wave resonator 100 shown in FIG. 1, the low impedance layer 252 is formed of a material having an acoustic impedance preferably lower than about 20 Mrayl, including, but not limited to, $SiO_2$, Al, CDO, MSQ, HSQ, nano-porous mixtures of MSQ and HSQ, nanoglass, aerogel, xerogel, SOG with the addition of pores in the final film, and spin-on siloxane monomers with additives to promote the formation of pores, parylene, or BCB. The high impedance layer 254 is formed of a material having an acoustic impedance preferably higher than about 40 Mrayl, including, but not limited to, tungsten, molybdenum, platinum, ruthenium, iridium, titanium tungsten, tantalum pentoxide, hafnium oxide, aluminum oxide, chromium silicide, niobium carbide, rhenium oxide, tantalum carbide, tantalum nitride, titanium carbide, titanium oxide, vanadium carbide, tungsten nitride, tungsten oxide, zirconium carbide, SiC, DLC, or Si-DLC.

Each of the low impedance layer 252 and the high impedance layer 254 has a thickness, ranging from about 20 nm to about 1000 nm.

Figure 3:
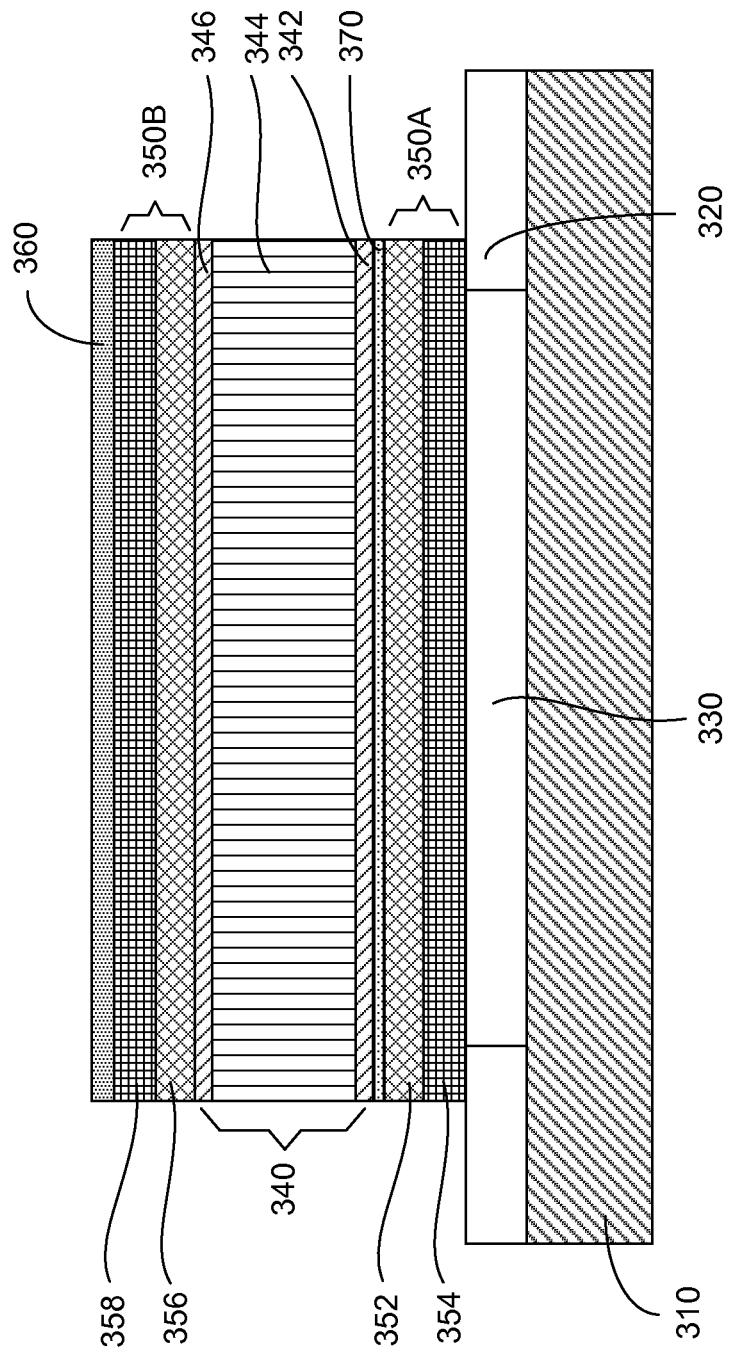
FIG. 3 shows schematically a cross sectional view of an acoustic wave resonator according to yet another embodiment of the present invention.

Referring to FIG. 3, an acoustic wave resonator 300 is schematically shown according to yet another embodiment of the present invention, where two pairs 350A and 350B of low and high impedance layers are used to reduce the trimming sensitivity of the acoustic wave resonator 300 and improve its immunity to external environmental change and aging effects. As shown in FIG. 3, the acoustic wave resonator 300 includes a substrate 310 defining an air cavity 330, the first pair 350A of low and high impedance layers formed on the substrate 310 and located over the air cavity 330, a seed layer 370 formed on the first pair 350A of low and high impedance layers, a resonator structure 340 having a bottom electrode 342 formed on the seed layer 370, a piezoelectric layer 344 formed on the bottom electrode 342, a top electrode 346 formed on the piezoelectric layer 344, a second pair 350B of low and high impedance layers formed on the top electrode 346 of the resonator structure 340, and a passivation layer 360 formed on the second pair 350B of low and high impedance layers.

The first pair 350A of low and high impedance layers includes a first high impedance layer 354 formed over the air cavity 330, and a first low impedance layer 352 formed between the first high impedance layer 354 and the seed layer 370. The second pair 350B of low and high impedance layers includes a second low impedance layer 356 formed on the top electrode 346, and a second high impedance layer 358 formed between the second low impedance layer 356 and the passivation layer 360.

The first and second low impedance layers 352 and 356 are formed of a same material or different materials having acoustic impedance preferably lower than about 20 Mrayl. The above disclosed low acoustic impedance materials can be used to form the first and second low impedance layers 352 and 356. Further, the first and second high impedance layers 354 and 358 are formed of a same material or different materials having acoustic impedance preferably higher than about 40 Mrayl. The above disclosed high acoustic impedance materials can be used to form the first and second high impedance layers 354 and 358. In addition, the thickness of each of the first and second low impedance layers 352 and 356 and the first and second high impedance layers 354 and 358 can be same or substantially different from one another.

Optionally, the air cavity 330 can be defined by a dielectric layer 320 formed on the substrate 310. In this case, the high impedance layer 354 is formed on the dielectric layer 320 and located over the air cavity 330, as shown in FIG. 3.

Figure 4:
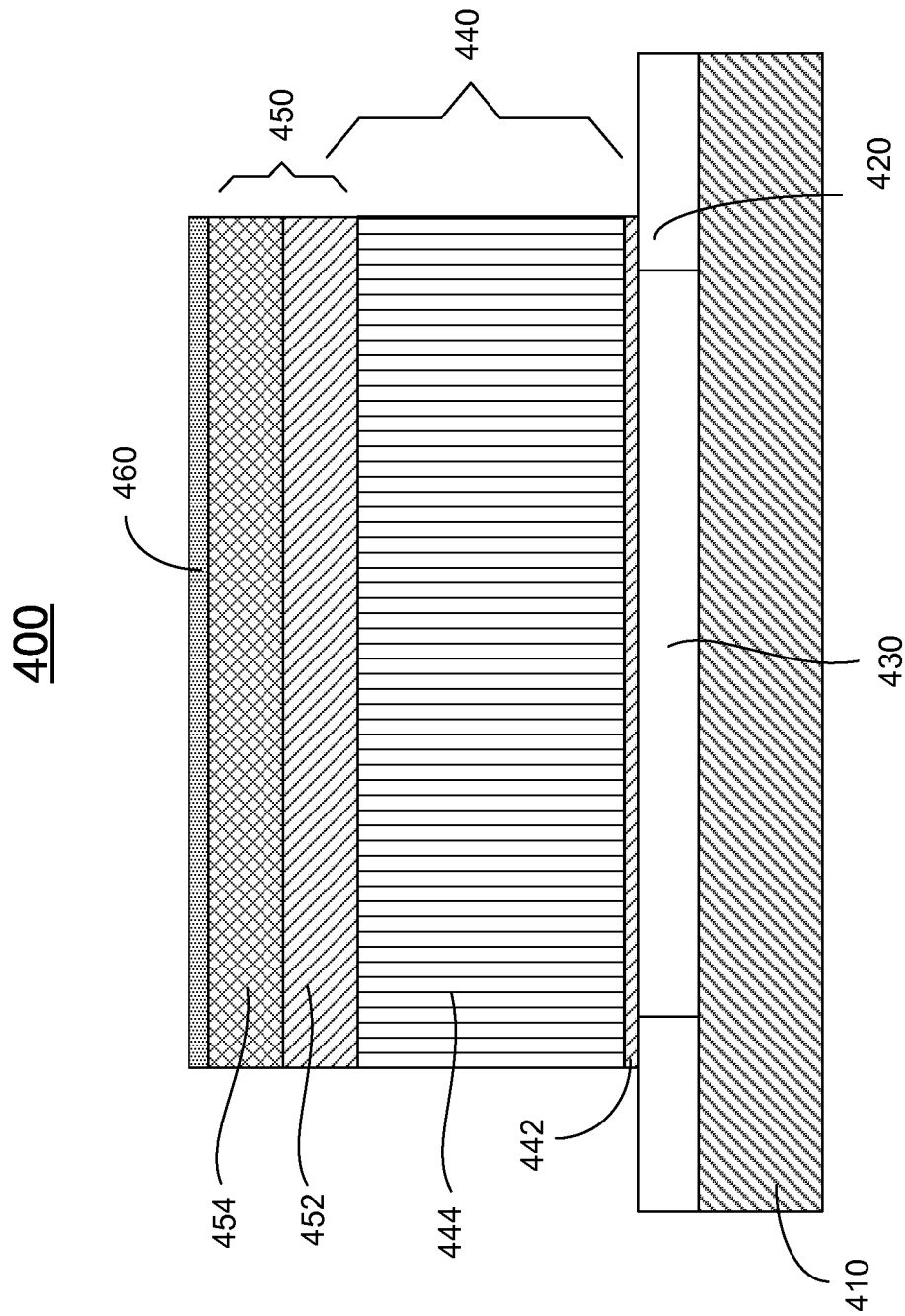
FIG. 4 shows schematically a cross sectional view of an acoustic wave resonator according to a further embodiment of the present invention.

As shown in FIG. 4, a further embodiment of an acoustic wave resonator 400 is schematically shown according to the present invention. In this embodiment, the acoustic wave resonator 400 has a bottom electrode 442 formed on a substrate 410 having an air cavity or an acoustic mirror 430 located under the bottom electrode 442, a piezoelectric layer 444 formed on the bottom electrode 442, a pair of low and high impedance layers 450 formed on the piezoelectric layer 444, and a passivation layer 460 formed on the pair of low and high impedance layers 450. The pair of low and high impedance layers 450 includes a low impedance layer 452 formed on the piezoelectric layer 444 and a high impedance layer 454 formed on the low impedance layer 452.

In the example, one of the pair of low and high impedance layers 450, preferably, the low impedance layer 452, serves as a top electrode, which in turn, together with the bottom electrode 442 and the piezoelectric layer 444, constitutes a resonator structure 440.

In this embodiment, the low impedance layer 452 is formed of a metal material such as Al and aluminum alloy. The high impedance layer 454 is formed of a material including tungsten, molybdenum, platinum, ruthenium, iridium, titanium tungsten, tantalum pentoxide, hafnium oxide, aluminum oxide, chromium silicide, niobium carbide, rhenium oxide, tantalum carbide, tantalum nitride, titanium carbide, titanium oxide, vanadium carbide, tungsten nitride, tungsten oxide, zirconium carbide, SiC, DLC, or Si-DLC. Each of the low impedance layer 452 and the high impedance layer 454 has a thickness. Each thickness is same or substantially different from one another, and can be in the range of 20 nm to 1000 nm.

For evaluating the trimming sensitivity of the acoustic wave resonator 400 that corresponds to configuration Nos. 8 and 9 in Table 1 of FIG. 7, the first electrode 442, the piezoelectric layer 444, the low acoustic impedance layer 452, the high acoustic impedance layer 454, and the passivation layer 460 are formed of Mo, AlN, Al, W, and $SiO_2$, respectively, with different thicknesses. In configuration No. 8, these thicknesses are of 0.29 μm, 2 μm, 0.787 μm, 0.636 μm, and 0.3 μm, respectively, while they are of 0.15 μm, 2.18 μm, 0.937 μm, 0.636 μm, and 0.3 μm, respectively, in configuration No. 9. The trimming sensitivity is about 1.9 kHz/Å for both of configuration No. 8 and No. 9, which is substantially reduced from 50.6 kHz/Å of the convention acoustic wave resonator (configuration No. 1). However, the $K_{t,eff}^2$ of configuration No. 9 is about 8% higher than that of configuration No. 8.

Figure 5:
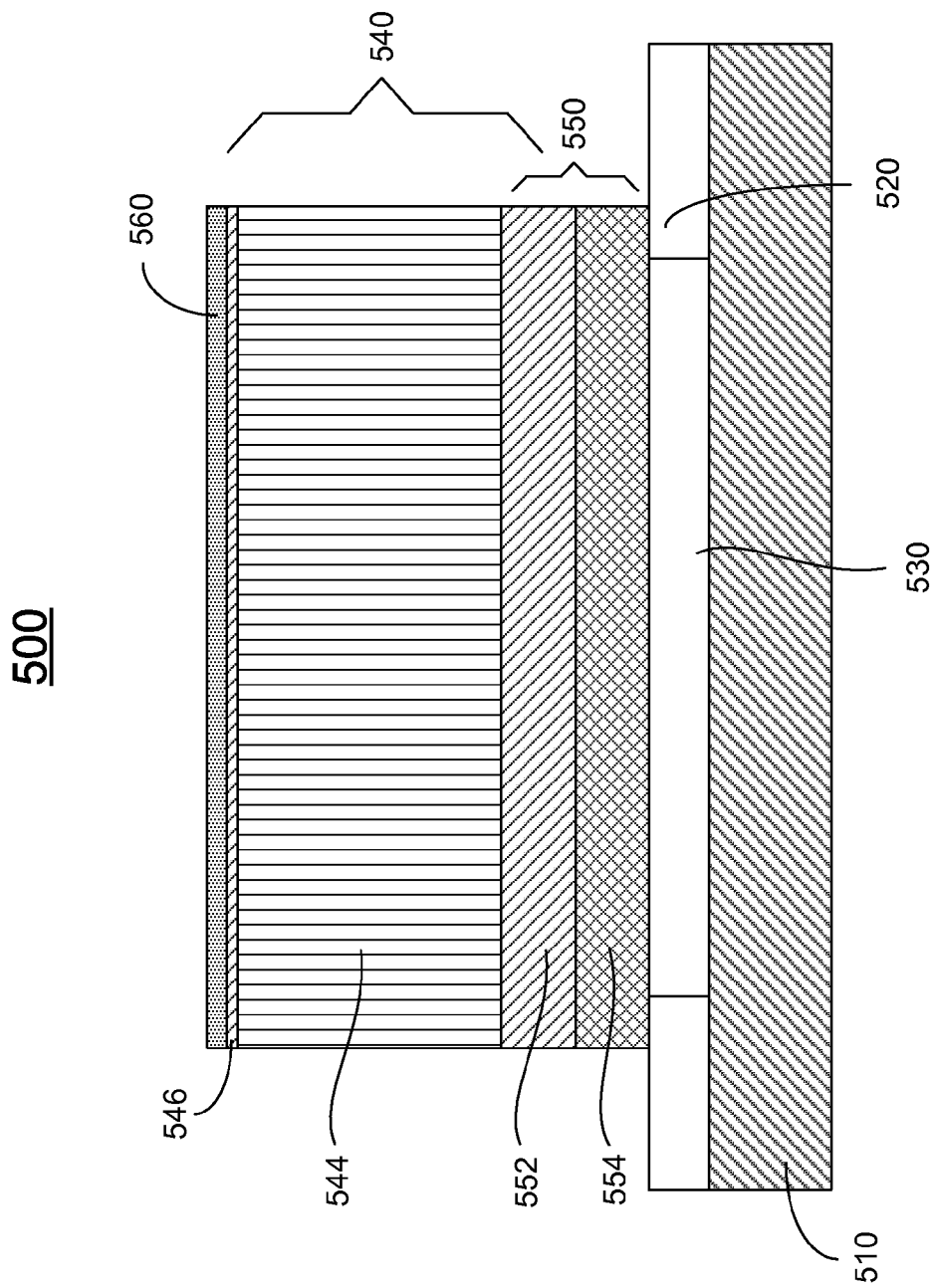
FIG. 5 shows schematically a cross sectional view of an acoustic wave resonator according to yet a further embodiment of the present invention.

Referring to FIG. 5, an acoustic wave resonator 500 is schematically shown according to yet a further embodiment of the present invention. Similar to the acoustic wave resonator 400 shown in FIG. 4, the acoustic wave resonator 500 also has a composite layered structure 550 having a low acoustic impedance layer 552 and a high acoustic impedance layer 554. However, the composite layered structure 550 is formed under the piezoelectric layer 544. Specifically, the high acoustic impedance layer 554 is formed on a substrate 510 having an air cavity 530. The low acoustic impedance layer 552 is formed on the high acoustic impedance layer 554. The piezoelectric layer 544 is formed on the low acoustic impedance layer 552. The top electrode 546 is formed on the piezoelectric layer 544. In the embodiment, the low acoustic impedance layer 552 serving as a bottom electrode, the piezoelectric layer 544 and the top electrode 546 constitutes a resonator structure 540. The utilization of the pair of low and high acoustic impedance layers 552 and 554 improves the immunity of the resonator to external environmental change and aging effects and provide an option to alter the dispersion characteristics upon needed.

Alternatively, the air cavity 530 can be defined by a dielectric layer 520 formed on the substrate 510. In this case, the high impedance layer 554 is formed on the dielectric layer 520 and located over the air cavity 530, as shown in FIG. 5.

Figure 6:
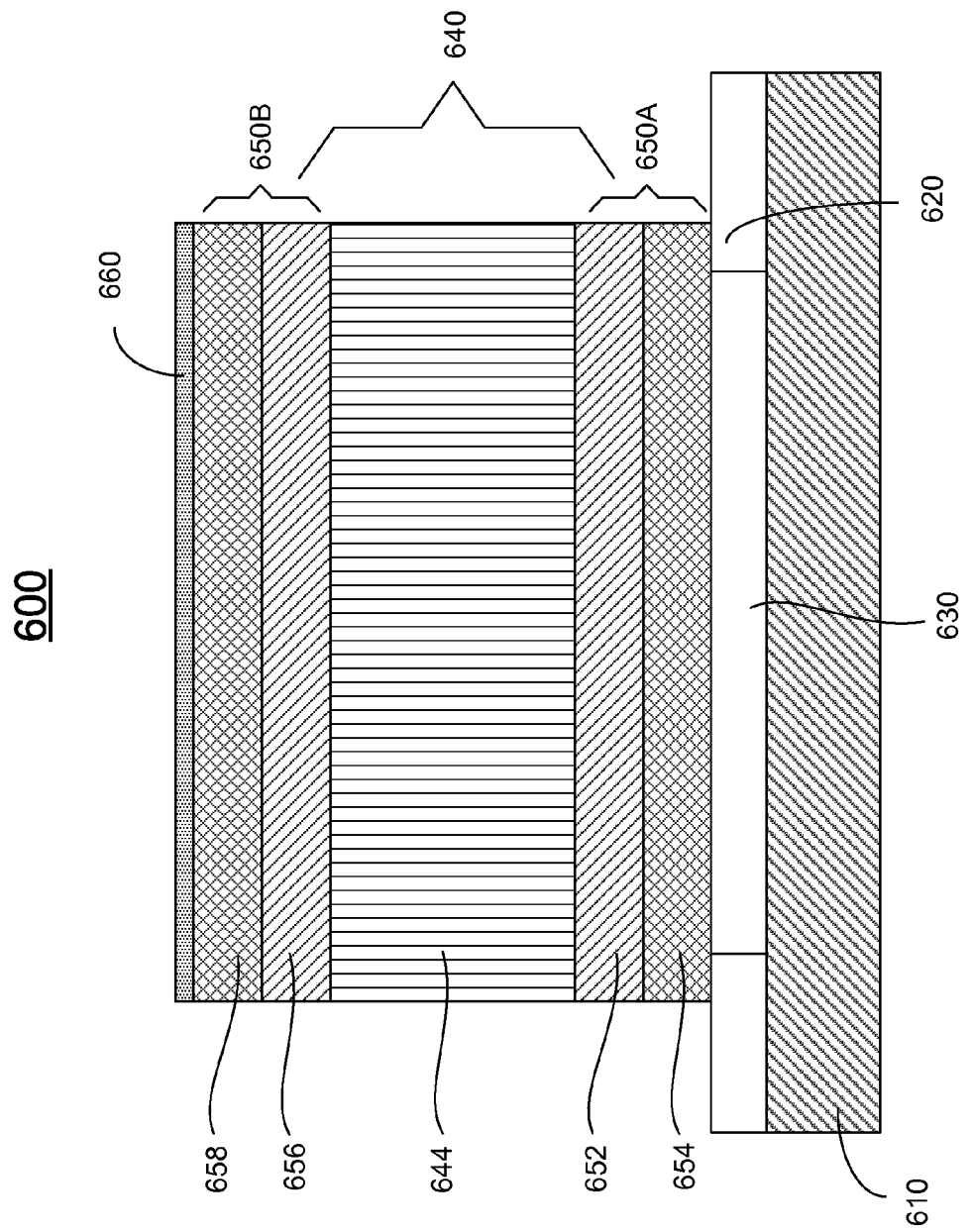
FIG. 6 shows schematically a cross sectional view of an acoustic wave resonator according to an alternative embodiment of the present invention.

As shown in FIG. 6, another embodiment of an acoustic wave resonator 600 is schematically shown according to the present invention. The acoustic wave resonator 600 has first and second pairs 650A and 650B of low and high acoustic impedance layers, and a piezoelectric layer 644 formed between the first and second pairs 650A and 650B of low and high acoustic impedance layers. The first pair 650A of low and high acoustic impedance layers has a first low acoustic impedance layer 652 and a first high acoustic impedance layer 654 formed on the substrate 610 and located over the air cavity 630. The second pair 650B of low and high acoustic impedance layers has a second low acoustic impedance layer 656 formed on the piezoelectric layer 644 and a second high acoustic impedance layer 658 formed on the second low acoustic impedance layer 656. In this embodiment, the first and second low acoustic impedance layers 652 and 656 serves as a bottom electrode and a top electrode, respectively, of the resonator structure 640. Preferably, they are formed of aluminum (Al) and aluminum alloy. The first and second high acoustic impedance layers 654 and 658 are formed of, for example, but not limited to, tungsten, molybdenum, platinum, ruthenium, iridium, titanium tungsten, tantalum pentoxide, hafnium oxide, aluminum oxide, chromium silicide, niobium carbide, rhenium oxide, tantalum carbide, tantalum nitride, titanium carbide, titanium oxide, vanadium carbide, tungsten nitride, tungsten oxide, zirconium carbide, SiC, DLC, or Si-DLC.

In addition, a passivation layer 660 is formed on the second high acoustic impedance layer 658.

One aspect of the present invention also provides an acoustic wave resonator fabricated on a substrate. The acoustic wave resonator includes a seed layer, a resonator structure having a first electrode formed on the seed layer, a piezoelectric layer formed on the first electrode, and a second electrode formed on the piezoelectric layer, and a composite layered structure associated with the resonator structure such that the immunity of the acoustic wave resonator to environmental change and aging effects is improved, the trimming sensitivity is substantially minimized, or dispersion characteristics of the acoustic wave resonator is optimized.

In one embodiment, the composite layered structure includes a plurality of layers alternately formed of a first material with high acoustic impedance and a second material with low acoustic impedance, where layers with high acoustic impedance and layers with low acoustic impedance are alternately adjacently disposed. In one embodiment, each of the plurality of layers has a thickness that is approximately equal to an odd integral multiple of one quarter of the wavelength in the material of the respective layer at the resonant frequency of the resonator.

In one embodiment, the composite layered structure includes a first layer with low acoustic impedance adjacent to the seed layer and a second layer with high acoustic impedance formed on the first layer such that the first layer is located between the seed layer and the second layer. In another embodiment, the composite layered structure further includes a third layer with low acoustic impedance formed on the second electrode of the resonator structure and a fourth layer with high acoustic impedance formed on the third layer.

In another embodiment, the composite layered structure includes a first layer with low acoustic impedance formed on the second electrode of the resonator structure and a second layer with high acoustic impedance formed on the first layer.

In summary, the present invention, among other things, recites an acoustic wave resonator that utilizes a composite layered structure including a plurality of layers alternately formed of a high acoustic impedance material and a low acoustic impedance material to improve the immunity to environmental change and aging effects, minimize the trimming sensitivity, and/or optimize the dispersion characteristics of the acoustic wave resonator.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An acoustic wave resonator comprising:
   (a) a substrate defining an air cavity;
   (b) a first pair of low and high impedance layers formed on the substrate and located over the air cavity;
   (c) a seed layer formed on the first pair of low and high impedance layers;
   (d) a first electrode formed on the seed layer;
   (e) a piezoelectric layer formed on the first electrode;
   (f) a second electrode formed on the piezoelectric layer;
   (g) a second pair of low and high impedance layers formed on the second electrode; and
   (h) a passivation layer formed on the second pair of low and high impedance layers,
   wherein the first pair of low and high impedance layers comprises a first high impedance layer formed over the air cavity, and a first low impedance layer formed between the first high impedance layer and the seed layer;
   wherein the second pair of low and high impedance layers comprises a second low impedance layer formed on the second electrode, and a second high impedance layer formed between the second low impedance layer and the passivation layer;
   wherein each of the first and second low impedance layers is formed of a first material having an acoustic impedance lower than about 20 Mrayl; and
   wherein each of the first and second high impedance layers is formed of a second material having acoustic impedance higher than about 40 Mrayl.

2. The acoustic wave resonator of claim 1, wherein the first material comprises $SiO_2$, aluminum (Al), carbon-doped silicon oxide (CDO), nano-porous methyl silsesquioxane (MSQ), nano-porous hydrogensilsesquioxane (HSQ), nano-porous mixtures of MSQ and HSQ, nanoglass, aerogel, xerogel, spin-on-glasses (SOG) with the addition of pores in the final film, and spin-on siloxane monomers with additives to promote the formation of pores, parylene, or benzocyclobutene (BCB); and
   wherein the second material comprises tungsten, molybdenum, platinum, ruthenium, iridium, titanium tungsten, tantalum pentoxide, hafnium oxide, aluminum oxide, chromium silicide, niobium carbide, rhenium oxide, tantalum carbide, tantalum nitride, titanium carbide, titanium oxide, vanadium carbide, tungsten nitride, tungsten oxide, zirconium carbide, silicon carbon (SiC), diamond-like carbon (DLC), or silicone doped diamond-like carbon (Si-DLC).

3. The acoustic wave resonator of claim 1, wherein each of the first and second low impedance layers and the first and second high impedance layers has a thickness in a range of about 20 nm to about 1000 nm.

4. The acoustic wave resonator of claim 1, wherein the passivation layer is formed of a material including silicon carbide (SiC), aluminum oxide ($Al_2O_3$), diamond, diamond-like carbon (DLC), silicon oxide ($SiO_2$), silicon nitride (SiN), hydrophobic polymer, or a combination thereof.

5. The acoustic wave resonator of claim 1, wherein the seed layer is formed of aluminum nitride, aluminum oxynitride, tungsten nitride, titanium tungsten nitride, silicon oxide, silicon nitride, silicon carbide, or a combination thereof.

* * * * *